US010896873B2

(12) United States Patent
Kwon et al.

(10) Patent No.: US 10,896,873 B2
(45) Date of Patent: Jan. 19, 2021

(54) MASSIVE DEEP TRENCH CAPACITOR DIE FILL FOR HIGH PERFORMANCE APPLICATION SPECIFIC INTEGRATED CIRCUIT (ASIC) APPLICATIONS

(71) Applicant: Google LLC, Mountain View, CA (US)

(72) Inventors: Woon Seong Kwon, Cupertino, CA (US); Nam Hoon Kim, San Jose, CA (US); Teckgyu Kang, Saratoga, CA (US)

(73) Assignee: Google LLC, Mountain View, CA (US)

( * ) Notice: Subject to any disclaimer, the term of this patent is extended or adjusted under 35 U.S.C. 154(b) by 20 days.

(21) Appl. No.: 16/358,197

(22) Filed: Mar. 19, 2019

(65) Prior Publication Data

US 2020/0161235 A1 May 21, 2020

Related U.S. Application Data

(60) Provisional application No. 62/768,689, filed on Nov. 16, 2018.

(51) Int. Cl.
  *H01L 23/522* (2006.01)
  *H01L 49/02* (2006.01)
(52) U.S. Cl.
  CPC .......... *H01L 23/5223* (2013.01); *H01L 28/60* (2013.01)
(58) Field of Classification Search
  CPC .......................... H01L 23/5223; H01L 28/60
  See application file for complete search history.

(56) References Cited

U.S. PATENT DOCUMENTS

2007/0228840 A1*  10/2007  Vikinski ............. H01L 27/0629
                                                        307/112
2010/0065944 A1*   3/2010  Tu ..................... H01L 27/10852
                                                        257/532

(Continued)

FOREIGN PATENT DOCUMENTS

CN    102569250 B    3/2014
CN    107359153 A    11/2017

OTHER PUBLICATIONS

International Search Report and Written Opinion for International Application No. PCT/US2019/060720 dated Feb. 24, 2020. 17 pages.

(Continued)

*Primary Examiner* — Nathan W Ha
(74) *Attorney, Agent, or Firm* — Lerner, David, Littenberg, Krumholz & Mentlik, LLP

(57) ABSTRACT

A processor assembly and a system including a processor assembly are disclosed. The processor assembly includes an interposer disposed on a substrate, an integrated circuit disposed on the interposer, a memory circuit disposed on the interposer and coupled to the integrated circuit, and a capacitor embedded in the interposer. The capacitor includes at least a first non-planar conductor structure and a second non-planar conductor structure separated by a non-planar dielectric structure. The capacitor includes a first capacitor terminal electrically coupling the first non-planar conductor structure to a first voltage terminal in the integrated circuit. The capacitor includes a second capacitor terminal electrically coupling the second non-planar conductor structure to a second voltage terminal in the integrated circuit. The capacitor includes an oxide layer electrically isolating the capacitor from the interposer.

20 Claims, 6 Drawing Sheets

(56) References Cited

U.S. PATENT DOCUMENTS

| | | | |
|---|---|---|---|
| 2010/0123199 A1* | 5/2010 | Kawahara | H01L 27/10894 257/379 |
| 2014/0203441 A1* | 7/2014 | Maki | H01L 27/10814 257/773 |
| 2015/0200242 A1 | 7/2015 | England | |
| 2015/0229208 A1* | 8/2015 | Kim | H01L 23/5223 257/299 |
| 2015/0250058 A1 | 9/2015 | Ramachandran et al. | |
| 2015/0264813 A1* | 9/2015 | Zhou | H01L 23/481 174/255 |
| 2015/0295019 A1* | 10/2015 | Wang | H01L 23/585 257/532 |
| 2015/0295020 A1* | 10/2015 | Tseng | H01L 27/0805 257/532 |
| 2015/0380480 A1* | 12/2015 | Ozawa | H01L 28/91 257/296 |
| 2016/0043068 A1* | 2/2016 | Ramachandran | H01L 27/0288 257/532 |
| 2016/0240527 A1 | 8/2016 | Ramachandran et al. | |
| 2019/0035674 A1* | 1/2019 | Chiu | H01L 21/28202 |
| 2019/0164905 A1 | 5/2019 | Hsieh et al. | |
| 2020/0098676 A1* | 3/2020 | Elsherbini | H01L 23/3675 |
| 2020/0135845 A1* | 4/2020 | Seidel | H01L 28/91 |

OTHER PUBLICATIONS

Robert Keim: "Clean Power for Every IC, Part 1: Understanding Bypass Capacitors—Technical Articles", Sep. 21, 2015 (Sep. 21, 2015), XP055664975, Retrieved from the Internet: <https://www.allaboutcircuits.com/technical-articles/clean-power-for-every-ic-part-1-understanding-bypass-capacitors/ [retrieved on Feb. 4, 2020]. 8 pages.

Office Action for Taiwanese Patent Application No. 108141538 dated Jul. 8, 2020. 10 pages.

\* cited by examiner

MASSIVE DEEP TRENCH CAPACITOR DIE FILL FOR HIGH PERFORMANCE APPLICATION SPECIFIC INTEGRATED CIRCUIT (ASIC) APPLICATIONS

CROSS REFERENCE TO RELATED APPLICATION

This application claims the benefit of U.S. Provisional Patent Application No. 62/768,689, filed Nov. 16, 2018, the entire contents and substance of which are incorporated by reference herein.

BACKGROUND

Computer processors require steady power supply voltages to perform correctly. Noise, glitches, dips, spikes, and other deviations from a constant, steady voltage provided to the processor can cause bit errors and, in extreme cases, damage to transistors in the processor. Decoupling capacitors are placed on the power supply lines in the vicinity of the processor to smooth the power supply voltages as observed at the processor. In some cases, capacitors can be provided on or in the processor packaging; however, space within the processor package is limited.

SUMMARY

At least one aspect is directed to a processor assembly. The processor assembly includes an interposer disposed on a substrate, an integrated circuit disposed on the interposer, a memory circuit disposed on the interposer and coupled to the integrated circuit, and a capacitor embedded in the interposer. The capacitor includes at least a first non-planar conductor structure and a second non-planar conductor structure separated by a non-planar dielectric structure. The capacitor includes a first capacitor terminal electrically coupling the first non-planar conductor structure to a first voltage terminal in the integrated circuit. The capacitor includes a second capacitor terminal electrically coupling the second non-planar conductor structure to a second voltage terminal in the integrated circuit. The capacitor includes an oxide layer electrically isolating the capacitor from the interposer.

At least one aspect is directed to a system. The system includes a printed circuit board and a processor assembly. The processor assembly includes an interposer disposed on a substrate, an integrated circuit disposed on the interposer, a memory circuit disposed on the interposer and coupled to the integrated circuit, and a capacitor embedded in the interposer. The capacitor includes at least a first non-planar conductor structure and a second non-planar conductor structure separated by a non-planar dielectric structure. The capacitor includes a first capacitor terminal electrically coupling the first non-planar conductor structure to a first voltage terminal in the integrated circuit. The capacitor includes a second capacitor terminal electrically coupling the second non-planar conductor structure to a second voltage terminal in the integrated circuit. The capacitor includes an oxide layer electrically isolating the capacitor from the interposer. The system includes a power converter disposed on the printed circuit board, the power converter. The power converter includes a first power converter terminal electrically connected to the first capacitor terminal via a first power supply line in the printed circuit board, and a second power converter terminal electrically connected to the second capacitor terminal via a second power supply line in the printed circuit board.

These and other aspects and implementations are discussed in detail below. The foregoing information and the following detailed description include illustrative examples of various aspects and implementations, and provide an overview or framework for understanding the nature and character of the claimed aspects and implementations. The drawings provide illustration and a further understanding of the various aspects and implementations, and are incorporated in and constitute a part of this specification.

BRIEF DESCRIPTION OF THE DRAWINGS

In the figures, elements with the same or similar reference numerals have the same or similar function or steps, unless otherwise indicated.

DETAILED DESCRIPTION

Figure 1:
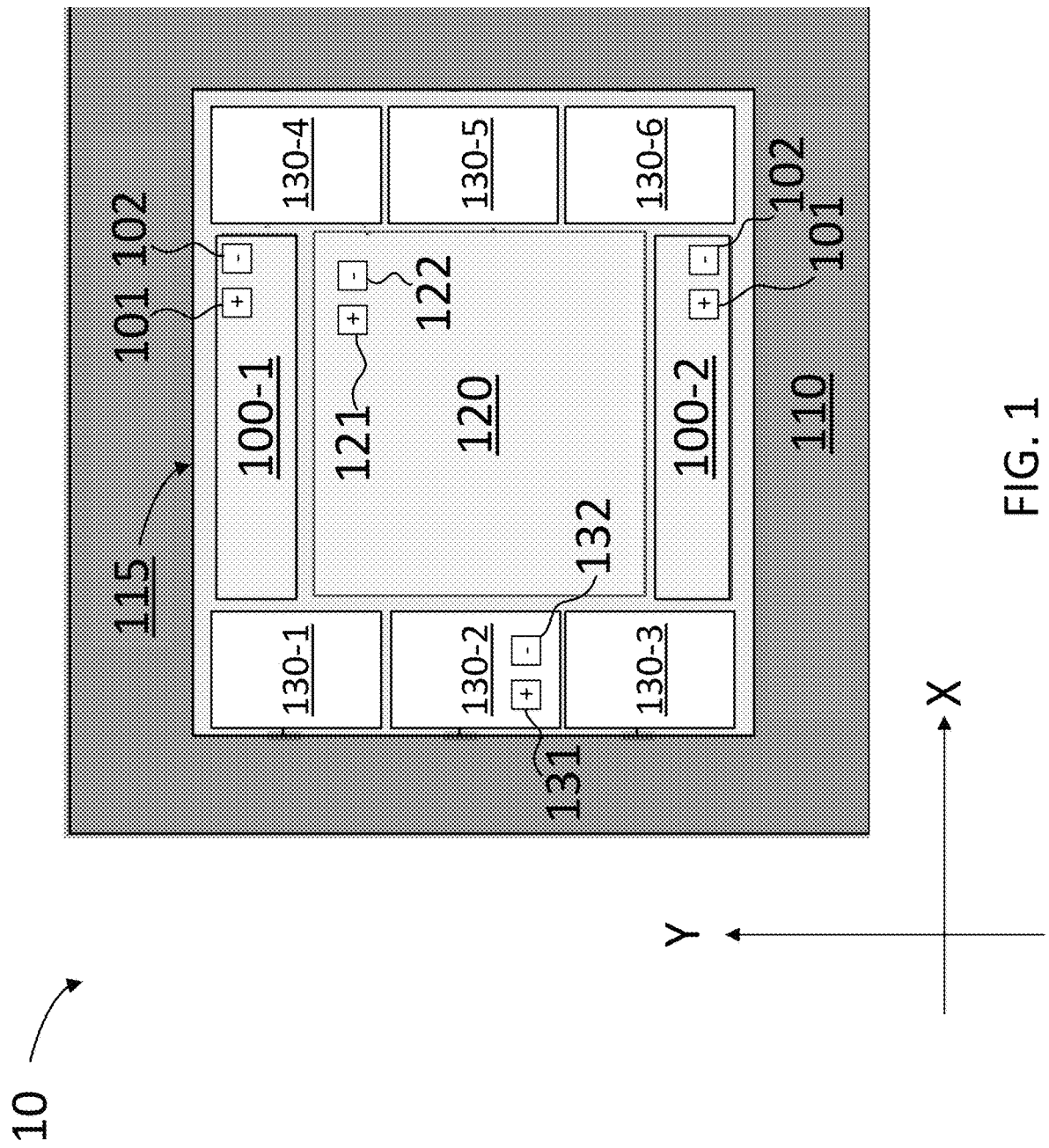
FIG. 1 illustrates a plan view of a first example device including an interposer with an integrated circuit, a memory circuit, and a capacitor disposed thereon, according to some implementations.

In the following detailed description, numerous specific details are set forth to provide a full understanding of the present disclosure. It will be apparent, however, to one ordinarily skilled in the art, that the implementations of the present disclosure can be practiced without some of these specific details. In other instances, well-known structures and techniques have not been shown in detail so as not to obscure the disclosure.

The disclosed system and method relate to integrated circuit packages with added capacitance to support integrated circuits, such as microprocessors, systems-on-chip (SoCs), and application-specific integrated circuits (ASICs), with high current draws and/or high rates of change in their current draw. The power supply lines of integrated circuit packages have a resistance R and an inductance L. The resistance of the power supply line causes a drop in voltage across the power supply line that is proportional to the current flowing through the power supply line. At high current draws, such as during periods of high processor utilization, the power supply voltages as observed at the integrated circuit can droop. The inductance of the power supply line causes a drop in voltage across the power supply line that is proportional to the change in current passing through the power supply line; that is the voltage "droop" is proportional to the factor $L di/dt$, where $di/dt$ is the change in current over time. During a period of a high rate of change of current draw by the integrated circuit, such as transitions between periods of low and high processor activity, the power supply voltages seen at the integrated circuit can experience an additional droop. Moreover, for a given rate of change—i.e., frequency, f—the power supply line may operate at a resonance related to a combination of R and L. At resonance, the power supply lines may present a much higher impedance Z between the power supply and the integrated circuit. In a resonance condition, voltage droop may be quite high. In a typical integrated circuit package, the resonant frequency may be in the range of approximately 20-300 MHz. In such circumstances, the integrated circuit is separated from a voltage regulator module (VRM) by the high impedance. Typically, capacitors placed on the PCB may mitigate inductive effects at lower frequencies (e.g., less than 20 MHz or so). And capacitors etched into the integrated circuit die itself may mitigate inductive effects at higher frequencies (e.g., more than 300 MHz or so). However, these solutions may not adequately address voltage drops caused by current increases and or fluctuations at intermediate frequency ranges (e.g., between 20 MHz and 300 MHz). Thus, capacitors on the PCB or etched into the integrated circuit may not sufficiently mitigate the inductive, resistive, and/or resonant effects of the supply power line to maintain steady power supply voltages on the integrated circuit. Therefore, additional capacitance located close to the integrated circuit may be necessary to maintain smooth power supply voltage levels at the integrated circuit.

An integrated circuit package may contain several silicon dies implementing, for example, as the integrated circuit and one or more memory circuits. The integrated circuit and memory circuits may be disposed on an interposer, which itself may be disposed on a substrate. The interposer may contain a plurality of through-silicon vias (TSVs) that carry power and signals to and from the substrate, which will have features for making electrical connections to a printed circuit board (PCB). The integrated circuit package may have a lid covering and protecting the silicon dies. The lid may have features for removing heat from the dies, such as one or more thermally conductive paths and/or surfaces that can, in some implementations, be mated to a heat sink or heat pump.

The silicon dies on the interposer may be arranged such that there is unused real estate—i.e., unoccupied space—on the interposer. Implementations disclosed herein propose placing capacitors disposed on or embedded in unoccupied regions of the interposer. The capacitors may include deep trench capacitors (DTCs) and other three-dimensional structures embedded in the interposer. Some advantages of this approach include the use of device area that is otherwise filled with dummy circuitry, and the compatibility of fabrication techniques, materials, and form factors between the deep trench capacitors and the semiconductor fabrication involved in the ICs and the memory circuits. Moreover, the capacitance that can be achieved by a DTC or other three-dimensional capacitive structures can be higher than capacitors etched into the integrated circuit or placed on the PCB, while having the advantage of being physically close to the integrated circuit.

The capacitors can provide the additional benefit of increasing the mechanical stability of the wafer by adding semiconductor and metal layers in unoccupied areas of the interposer. Further, the three-dimensional structure of the capacitors in some implementations results in devices having a similar profile as the integrated circuits and memory circuits in the device; that is, extending to a same or similar height over the substrate. This simplifies the capping of the package with epoxy or any other dielectric layer, substantially reducing any residual amount of capping layer after polish, thereby improving the thermal conductivity of the package.

FIG. 1 illustrates a plan view of a first example device 10 including an interposer 115 with an integrated circuit 120; memory circuits 130-1, 130-2, 130-3, 130-4, 130-5, and 130-6 (collectively "memory circuits 130"); and capacitors 100-1 and 100-2 (collectively "capacitors 100") disposed on the interposer 115. Each of the integrated circuit 120, memory circuits 130, and capacitors 100 can be partially surrounded by an oxide layer that electrically isolates them from each other and from the interposer 115. The interposer 115 and components are disposed on a substrate 110. The substrate 110 can be disposed onto a printed circuit board (PCB).

The interposer 115 can be a silicon die or wafer with through silicon vias (TSVs) to carry electrical power and signals between the substrate 115 and the components disposed on the interposer 115; e.g., the integrated circuit 120. The substrate 110 can be an organic substrate such as a polymer, ceramic, or composite such as fiberglass. The substrate 110 can include vias, wires, and/or conductive traces to carry electrical power and signals between the PCB and the interposer. The substrate 110 can additionally provide mechanical reinforcement to the interposer and the silicon dies thereon. In some implementations, the substrate can include electrical contacts, such as copper pads or pins, on its bottom surface. In some implementations, the contacts may include solder balls forming a ball-grid array (BGA).

The integrated circuit 120 can be any type of processing die, such as general purpose microprocessor, a system-on-chip (SoC), a field-programmable gate array (FPGA), application-specific integrated circuit (ASIC) or the like. In some implementations, the integrated circuit 120 can operate at high clock speeds and data rates, and dissipate a lot of power in the process. For example, the integrated circuit 120 may consume tens or hundreds of amps of current, and tens or hundreds of watts of power. The integrated circuit 120 may have the ability to rapidly transition from a low-activity or low-power mode or state, such as a quiescent, standby, or hibernating state, to a high-activity or high-power state, such as when it receives one or many requests in quick succession to perform computationally intense operations. During such transitions, the amount of current required by the integrated circuit 120 may increase rapidly. Both the amount of current consumed by the integrated circuit 120 and the time-rate of change of current consumed by the integrated circuit 120 can cause voltage droop in the power supply voltages, as previously described. In addition, in some cases the combined resistance and inductance of the power supply lines providing current to the integrated circuit 120 may have a resonance at or near a frequency corresponding to the rate of change of current draw. In such cases, the voltage droop can be severe. In all cases, a voltage droop greater than, for example, one or two tenths of a volt (for a processor operating at 1.1V) can cause bit errors. In extreme cases, the bit errors may cause the integrated circuit 120 to enter into an unrecoverable state, requiring a complete reboot.

The memory circuits 130 include caches and other random-access memory (RAM) used by the integrated circuit 120. The memory circuits 130 can include memory blocks of dynamic RAM, static RAM, and the like. The memory circuits 130 also require power for reading, writing, and, in some cases, maintaining data stored thereon. The power requirements may be lower than those of the integrated circuit 120; however, the memory circuits 130 may share the same power supply lines entering the device 10 from a power supply or power converter on the PCB or elsewhere in the system. Voltage droop caused by the power demands of the integrated circuit 120 may therefore also cause errors in the operations of the memory circuits 130.

The integrated circuit 120 and the memory circuits 130 may not combine to form a shape that completely covers the usable area of the interposer 115. This disclosure therefore proposes filling the unoccupied space of the interposer 115 with capacitors, such as the capacitors 100. The capacitors 100 can fill the area of the interposer 115 unoccupied by the integrated circuit 120 and memory circuits 130, and take the place of a dummy fill. In some implementations, the capacitors 100 may include a deep-trench capacitor. A deep-trench capacitor differs from conventional capacitors in the physical structure of its conductor and dielectric layers. A conventional capacitor typically has parallel, planar conductor and dielectric layers. Some types of conventional capacitors, such as electrolytic capacitors, have a structure with cylindrical conductor and dielectric layers, such as would be formed by taking planar layers and rolling them up into a tube. In contrast, a deep-trench capacitor is made up of non-planar conductor and dielectric layers. The layers can be bended or folded in a structure that can be embedded into the interposer 115. A cross-sectional view of an example deep-trench capacitor structure is described below with reference to FIG. 3. Using a deep-trench capacitor as the capacitor 100 can provide several benefits. First, the density of the capacitance provided per unit area can be much higher than that of convention capacitors, including up to 0.5 uF/mm$^2$ or more. Deep-trench capacitors can be manufactured on a similar platform and using similar processes as the interposer 115, the integrated circuit 120, and/or the memory circuits 130; for example, in a 12 inch silicon wafer platform. Deep-trench capacitors can also improve the mechanical stability of the device 10 by adding mechanical stiffness to the interposer 115, due to the inherent structural stability of the non-planar, three-dimensional structure of the layers. In some embodiments, a total capacitance of all of the capacitors 100 within the device 10 may exceed 10 uF. In some implementations, the total capacitance can exceed 10 uF. In some implementations, the total capacitance can be between 25 and 32 uF. In some implementations, the total capacitance can exceed 32 uF.

The capacitors 100, integrated circuit 120, and memory circuits 130 can receive power supply voltages via power supply lines traversing the PCB, substrate 110, and interposer 115, and electrically coupling to terminals on each of the dies. For example, a capacitor (or each capacitor) can have a first capacitor terminal electrically coupling a first conductor structure to a first voltage terminal in the integrated circuit. The first capacitor terminal can receive a first power supply voltage from a first power supply line coming from a power supply or power convertor on the PCB or elsewhere in the system. The first voltage terminal of the integrated circuit can provide the first power supply voltage as, for example, a drain drive voltage (VDD) in a complementary metal-oxide-semiconductor (CMOS) circuit. Similarly, the capacitor (or each capacitor) can have a second capacitor terminal electrically coupling a second conductor structure to a first second terminal in the integrated circuit. The second capacitor terminal can receive a second power supply voltage from a second power supply line coming from the power supply. The second voltage terminal of the integrated circuit can provide the second power supply voltage as, for example, a sink source voltage (VSS, ground, "bulk," and the like) in a CMOS circuit.

Figure 2:
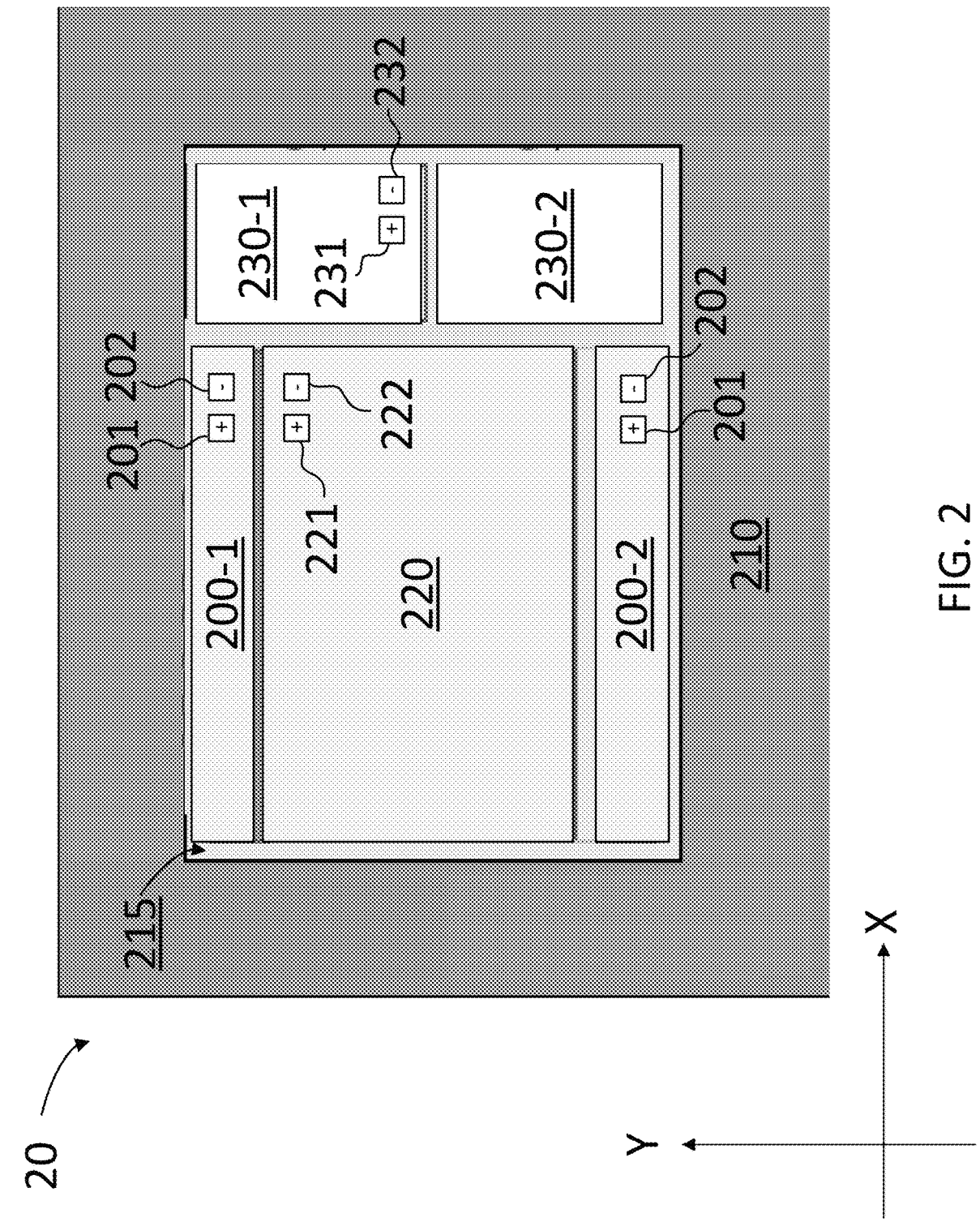
FIG. 2 illustrates a plan view of a second example device including an interposer with an integrated circuit, a memory circuit, and a capacitor disposed thereon, according to some implementations.

FIG. 2 illustrates a plan view of a second example device 20 including an interposer 215 with an integrated circuit 220, memory circuits 230-1 and 230-2 (collectively "memory circuits 230"), and capacitors 200-1 and 200-2 (collectively "capacitors 200") disposed thereon. Each of the integrated circuit 220, memory circuits 230, and capacitors 200 can be partially surrounded by an oxide layer that electrically isolates them from each other and from the interposer 215. The interposer 215 and components are disposed on a substrate 210. The substrate 210 can be disposed onto a printed circuit board (PCB). Each of the interposer 215, the integrated circuit 220, the memory circuits 230, the capacitors 200, and the substrate 210 can be similar or identical to the similarly named components of the device 10 described previously with respect to FIG. 1. In some implementations, the capacitors 200 substantially cover an area of interposer 215 that is not covered by the integrated circuit 220 and by the memory circuits 230. Accordingly, in some embodiments the capacitors 200 fill, or almost completely fill, the empty space of the interposer 215 unoccupied by the integrated circuit 220 or the memory circuits 230.

Figure 3:
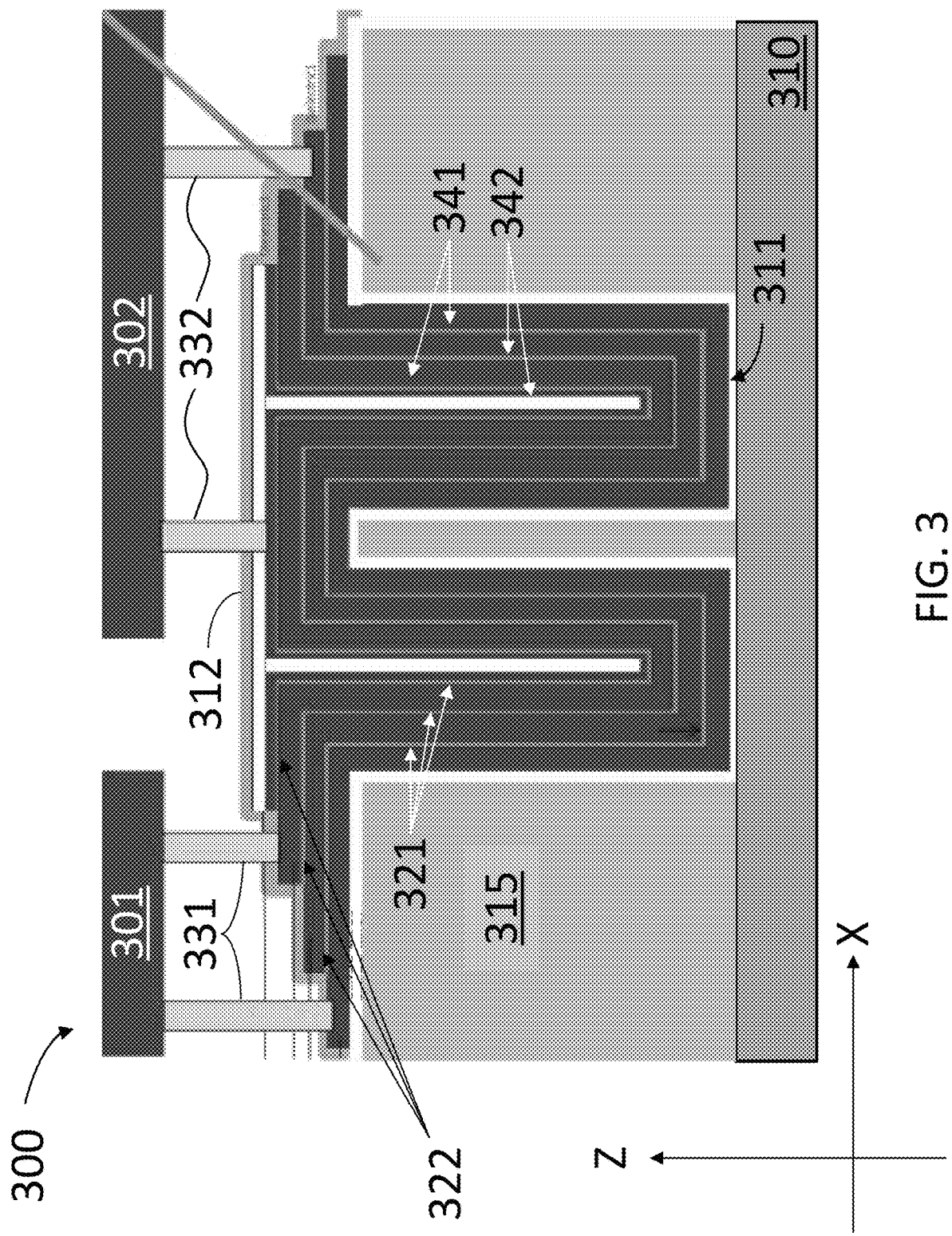
FIG. 3 illustrates a cross-sectional view of a capacitor embedded in an interposer, according to some implementations.

FIG. 3 illustrates a cross-sectional view of a capacitor 300 embedded in an interposer 315, according to some implementations. The capacitor 300 is an example of the type of capacitor that can be used for capacitors 100 and/or 200 discussed above. The capacitor 300 and the interposer 315 are disposed over a substrate 310, which can be similar to the substrates 110 and 210 previously described. The capacitor 300 includes a non-planar or three-dimensional structure of alternating conductor layers 341 and 342 and dielectric layers 321 and 322. The conductor layers 341 and 342 are electrically isolated from the interposer 315 by an oxide layer 311. A covering dielectric or insulating layer 312 protects the exposed portions of the capacitor 300, and can prevent short circuits between the ends of the conductor layers 341 and 342. The capacitor 300 includes a first terminal 301, which can, via conductive pillars 331, couple a first plurality of the conductor layers 341 to a first voltage terminal in an integrated circuit or memory circuit; for example one of the integrated circuits 120 or 220, or one of the memory circuits 130 or 230. The capacitor 300 includes a second terminal 302, which can, via conductive pillars 332, couple a second plurality of the conductor layers 342 to a second voltage terminal in the integrated circuit and or memory circuits.

In some implementations, the first terminal 301 and the second terminal 302 extend to a same height over the substrate 310 as the integrated circuit and the memory circuit. This can simplify packaging of the device with, for example, a lid covering the capacitor 300, integrated circuit, and memory circuit.

In some implementations, a first dielectric layer 321 is positioned in a plane perpendicular to the substrate 310, and a second dielectric layer portion 322 is positioned in a plane parallel to the substrate 310. In some implementations, the first dielectric layer 321 and the second dielectric layer portion 322 are respective portions of contiguous dielectric layers having a structure that includes a dielectric layer partially positioned in a first plane parallel to the substrate and partially positioned in a second plane perpendicular to the substrate 310.

In some implementations, the non-planar dielectric structure of the capacitor includes a corrugated structure having a first plurality of dielectric layer portions positioned in a first plane parallel to the substrate and joined at each side by respective second and third pluralities of dielectric layer portions positioned in a second plane perpendicular to the substrate. The dielectric layer portions are interspersed with conductor layers.

Figure 4:
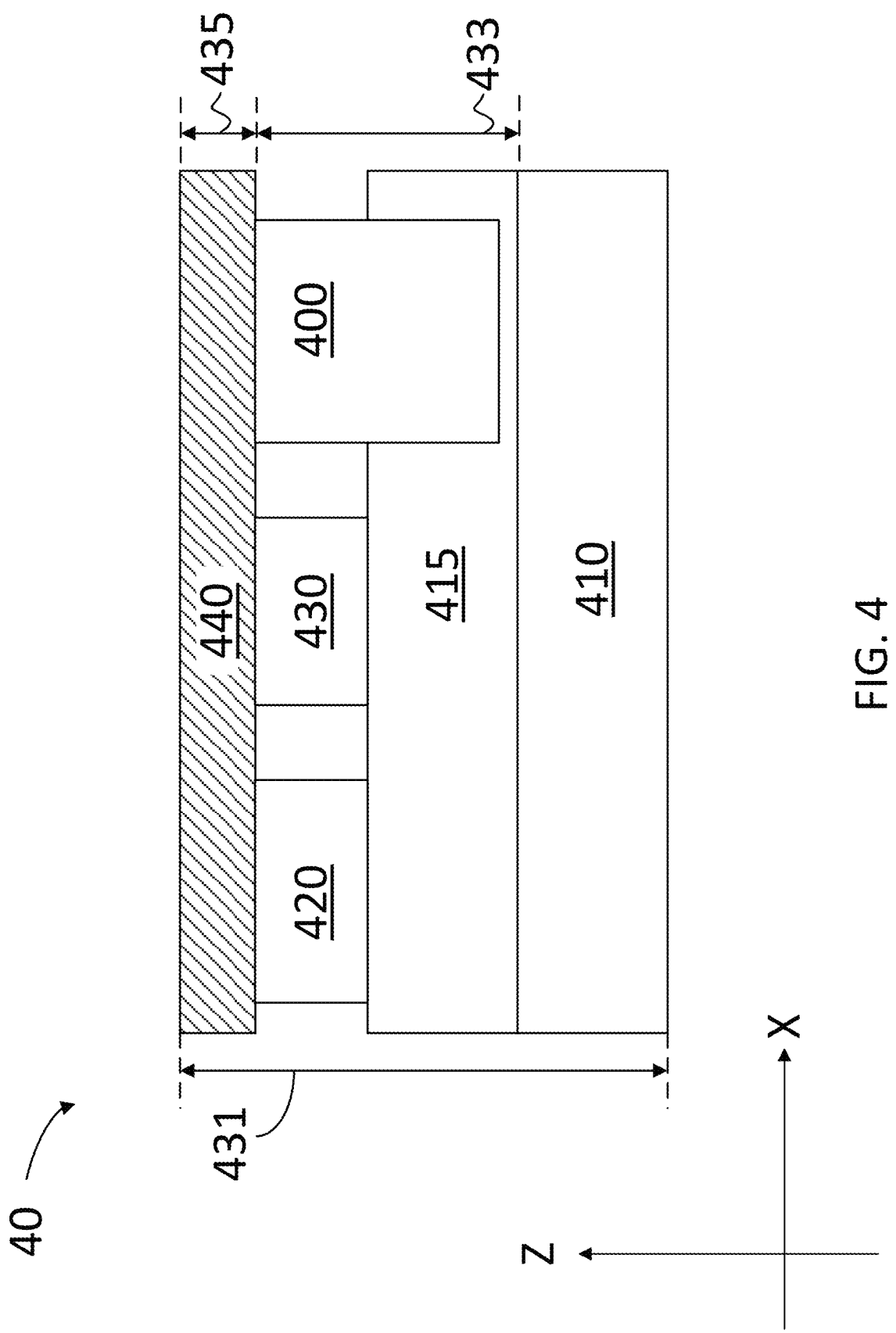
FIG. 4 illustrates a cross-sectional view of a device having an integrated circuit, a memory circuit, and a capacitor disposed on an interposer, according to some implementations.

FIG. 4 illustrates a cross-sectional view of a device 40 having an integrated circuit 420, a memory circuit 430, and a capacitor 400 disposed on an interposer 415, according to some implementations. The interposer 415 itself is disposed on a substrate 410. The integrated circuit 420, memory circuit 430, capacitor 400, and substrate 410 can be similar to the respective devices similarly named in the preceding description.

The device 40 includes a protective cap layer 440 disposed over the integrated circuit 420, the memory circuit 430, and the capacitor 400. In some implementations, the profile of integrated circuit 420, the memory circuit 430, and the capacitor 400 has approximately the same height 433 over and relative to the substrate 410, as measured along the Z-direction; that is, in a direction normal to the plane of the substrate 410 and/or the interposer 415. In some implementations, the protective cap layer 440 has a uniform thickness 435 covering the integrated circuit 420, the memory circuit 430, and the capacitor 400 to add to a total device thickness 431. Such configuration is convenient in order to address planarity considerations (e.g., to avoid wafer warpage) in the overall structure of device 40. Further, in many applications, a uniform protective cap layer 440 may be polished as desired to reduce its thickness 435 and promote dissipation of heat from the integrated circuit 420.

Figure 5:
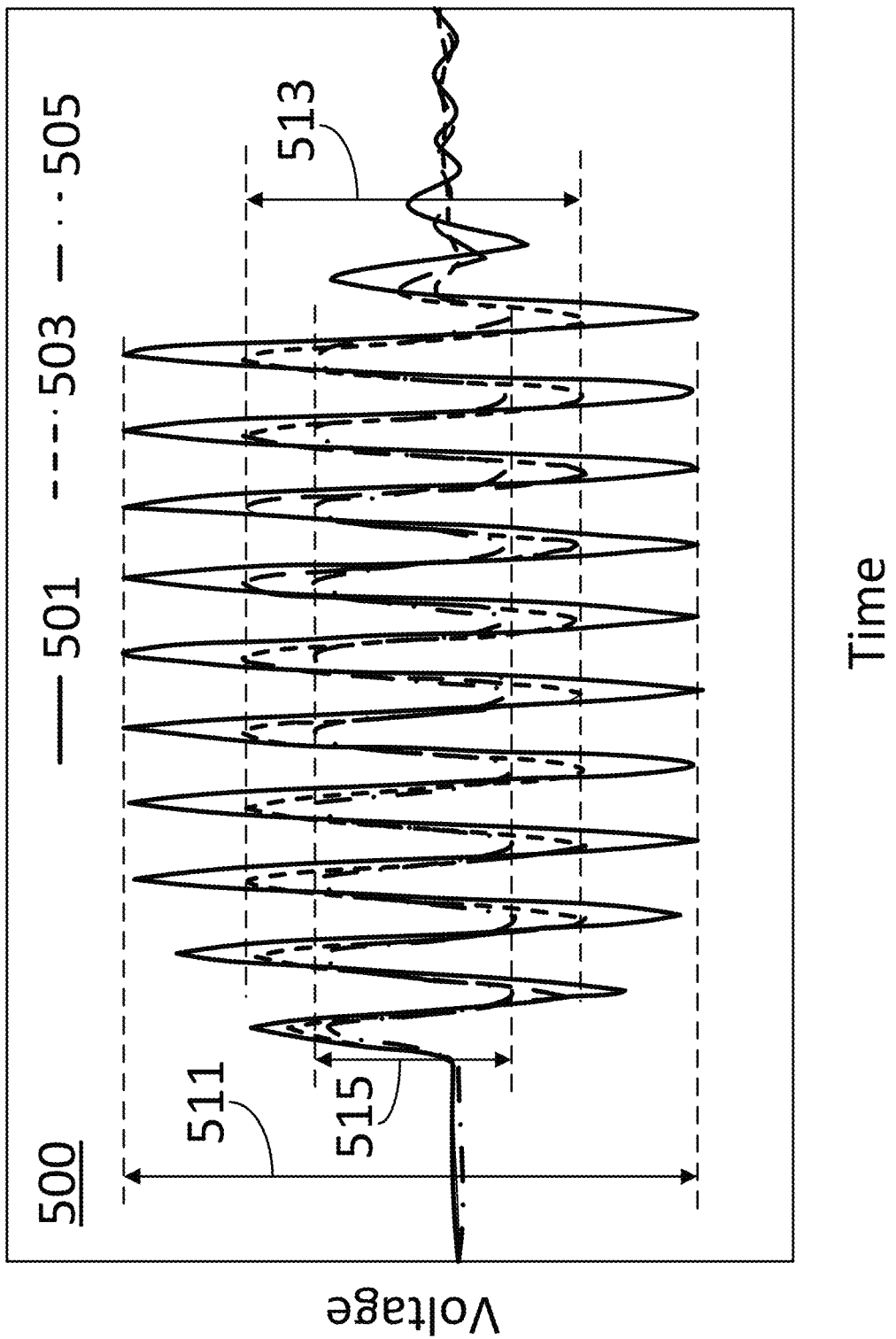
FIG. 5 illustrates a graph depicting voltage droop experienced by integrated circuits in various packaging arrangements.

FIG. 5 illustrates a graph 500 depicting voltage droop experienced by integrated circuits in various packaging arrangements. The graph 500 illustrates voltage over time, and includes three curves 501, 503, and 505 showing the power supply voltage observed at the integrated circuit.

The curve 501, provided as a baseline, represents voltage droop across a device with no added package capacitance. Accordingly, a voltage droop amplitude 511 of 73 mVp-p is observed.

The curve 503 is obtained for a device having an in-package capacitor as disclosed herein (e.g., the capacitors 100, 200, 300 or 400). In the implementation corresponding to the curve 503, the in-package capacitor has a capacitance of approximately 60 micro-Farad (1 uF=$10^{-6}$ Farad), and the power supply lines have a resistance of 1 milliohm (1 mOhm=$10^{-3}$ Ohm), and an inductance of 3 pico-Henry (1 pH=$10^{-12}$ Henry). The in-package capacitors reduce the voltage droop to an amplitude 513 of about 42 mVp-p.

The curve 505 is obtained with an in-package capacitor as disclosed herein (e.g., the capacitors 100, 200, 300 or 400) and having a capacitance of approximately 60 uF. In this example, the power supply lines have a reduced resistance of approximately 0.5 milliohm, and a reduced inductance of about 1 pH, resulting in the lowest voltage droop amplitude 515 of 23 mVp-p. The graph 500 illustrates that a package capacitor as disclosed herein results in a substantive reduction of the voltage droop effect. The graph 500 further illustrates the desirability of reducing the inductance and resistance of the power supply lines to further suppress voltage droop.

Figure 6:
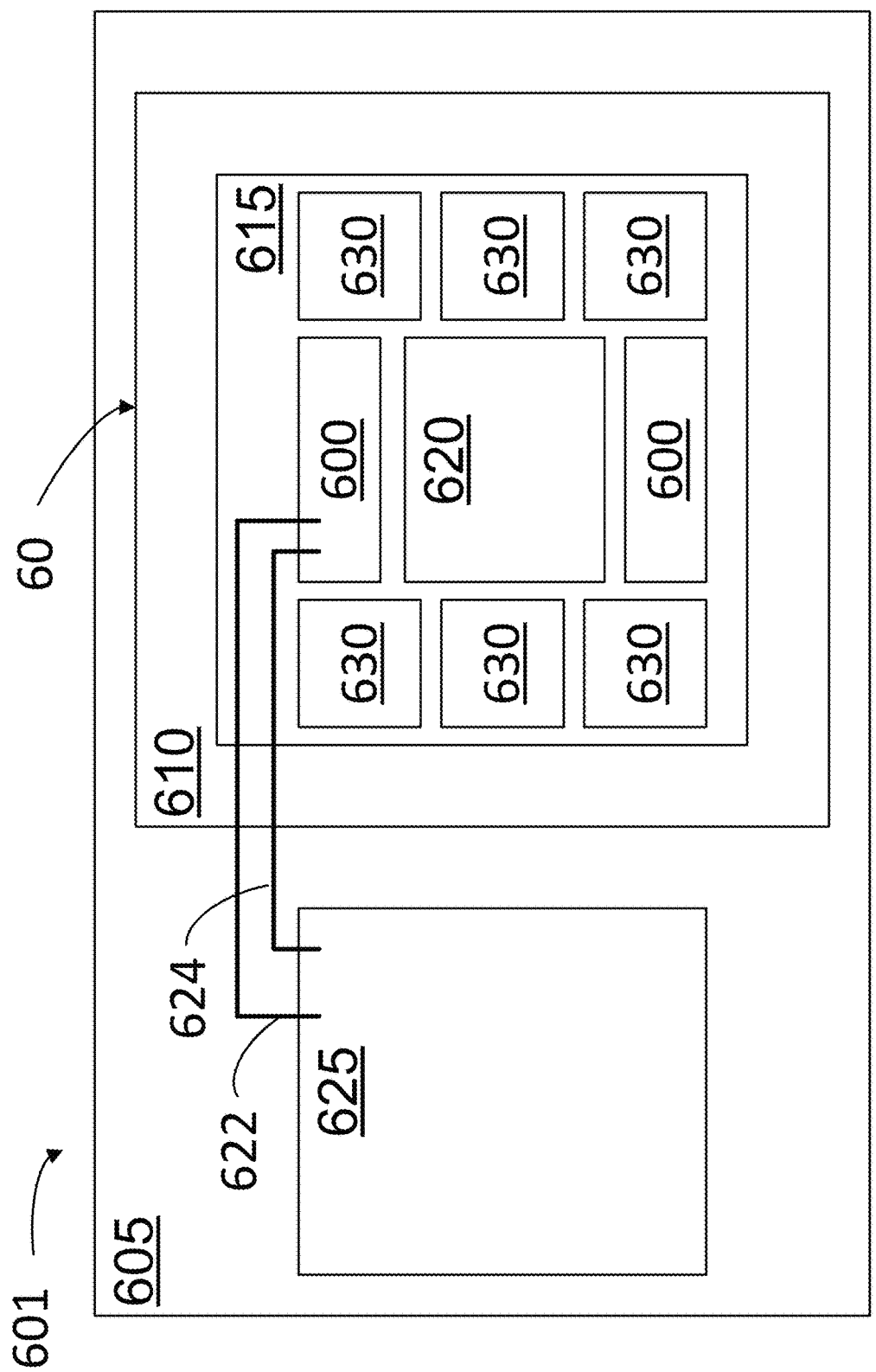
FIG. 6 illustrates a system including a power supply and a device having an integrated circuit, according to some implementations.

FIG. 6 illustrates a system 601 including a power supply 625 and a device 60 having an integrated circuit 620, according to some implementations. The power supply 625 can be a power convertor or regulator configured to provide steady supply voltages for the circuitry in the system 601 including the device 60. The device 60 can be similar to the devices 10, 20, and/or 40 previously described. The device 60 and the power supply 625 are disposed on a printed circuit board 605. The device 60 includes the integrated circuit 620, memory circuits 630, and capacitors 600 disposed on an interposer 615, which is itself disposed on a substrate 610. The integrated circuit 620, memory circuits 630, capacitors 600, interposer 615, and substrate 610 can be similar to the respective devices similarly named in the preceding description. The system 601 includes a first power supply line 622 and a second power supply line 624 providing current to, and receiving return current from, respectively, the device 60. In some implementations, there may be multiple or many first power supply lines 622 and second power supply lines 624 between the power supply 625 and the device 60. In some implementations, the power supply lines 622 and 624 may change in number; for example, the power supply lines 622 and 624 may consist of respective copper planes in the PCB 605, but branch out into many conductors, traces, or vias through the substrate 610, the interposer 615, and into the integrated circuit 620 and other electrical components of the device 60.

The system 601 is an example implementation of an arrangement of the device 60 and the power supply 625 that allows the system 601 to achieve the benefits of the in-package capacitors 600. For example, the power supply lines 622 and 624 may have a series resistance and inductance that cause the integrated circuit 620 (and also possibly the memory circuits 630) to experience a voltage droop during periods of high current draw by the integrated circuit 620 or high rates of change of current draw by the integrated circuit 620. The capacitors 600 can decouple the integrated circuit 620 from the power supply lines 622 and 624 in that the capacitors 600 can continue to provide current to the integrated circuit 620 at close to the specified voltages despite the voltage droop that would otherwise be experienced over the power supply lines 622 and 624. Furthermore, in some implementations, the capacitors 600 may shift, counteract, or otherwise mitigate a resonance caused by the combination of the inductance and resistance of the power supply lines 622 and 624. In some implementations, additional benefits may be achieved by reducing the resistance and inductance of the power supply lines 622 and 624 by increasing the effective cross-sectional area of the conductors through which the power supply lines 622 and 624 travel; for example, by adding copper layers in the PCB 605, adding connections into the substrate 610, or adding through-silicon vias (TSVs) in the interposer 615, etc.

As used herein, the phrase "at least one of" preceding a series of items, with the terms "and" or "or" to separate any of the items, modifies the list as a whole, rather than each member of the list (e.g., each item). The phrase "at least one of" does not require selection of at least one item; rather, the phrase allows a meaning that includes at least one of any one of the items, and/or at least one of any combination of the items, and/or at least one of each of the items. By way of example, the phrases "at least one of A, B, and C" or "at least one of A, B, or C" each refer to only A, only B, or only C; any combination of A, B, and C; and/or at least one of each of A, B, and C. To the extent that the term "include," "have," or the like is used in the description or the claims, such term is intended to be inclusive in a manner similar to the term "comprise" as "comprise" is interpreted when employed as a transitional word in a claim.

A reference to an element in the singular is not intended to mean "one and only one" unless specifically stated, but rather "one or more." The term "some" refers to one or more. All structural and functional equivalents to the elements of the various configurations described throughout this disclosure that are known or later come to be known to those of ordinary skill in the art are expressly incorporated herein by reference and intended to be encompassed by the subject technology. Moreover, nothing disclosed herein is intended to be dedicated to the public regardless of whether such disclosure is explicitly recited in the above description.

While this specification contains many specifics, these should not be construed as limitations on the scope of what may be claimed, but rather as descriptions of particular implementations of the subject matter. Certain features that are described in this specification in the context of separate implementations can also be implemented in combination in a single implementation. Conversely, various features that are described in the context of a single implementation can also be implemented in multiple implementations separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

The subject matter of this specification has been described in terms of particular aspects, but other aspects can be implemented and are within the scope of the following claims. For example, while operations are depicted in the drawings in a particular order, this should not be understood as requiring that such operations be performed in the particular order shown or in sequential order, or that all illustrated operations be performed, to achieve desirable results. The actions recited in the claims can be performed in a different order and still achieve desirable results. As one example, the processes depicted in the accompanying figures do not necessarily require the particular order shown, or sequential order, to achieve desirable results. In certain circumstances, multitasking and parallel processing may be advantageous. Moreover, the separation of various system components in the aspects described above should not be understood as requiring such separation in all aspects, and it should be understood that the described program components and systems can generally be integrated together in a single software product or packaged into multiple software products. Other variations are within the scope of the following claims.

What is claimed is:

1. A processor assembly, comprising:
   an interposer disposed on a substrate;
   an integrated circuit directly disposed on the interposer;
   a memory circuit directly disposed on the interposer and coupled to the integrated circuit; and
   a capacitor at least partially embedded in the interposer, the capacitor including:
      at least a first non-planar conductor structure and a second non-planar conductor structure separated by a non-planar dielectric structure;
      a first capacitor terminal electrically coupling the first non-planar conductor structure to a first voltage terminal in the integrated circuit;
      a second capacitor terminal electrically coupling the second non-planar conductor structure to a second voltage terminal in the integrated circuit; and
      an oxide layer electrically isolating the capacitor from the interposer.

2. The processor assembly of claim 1, wherein the first voltage terminal in the integrated circuit is coupled to a drain voltage in a complementary metal-oxide-semiconductor circuit of the integrated circuit.

3. The processor assembly of claim 1, wherein the second voltage terminal in the integrated circuit is coupled to a source voltage in a complementary metal-oxide-semiconductor of the integrated circuit.

4. The processor assembly of claim 1, wherein the first capacitor terminal and the second capacitor terminal extend to a same height over the substrate as the integrated circuit and the memory circuit.

5. The processor assembly of claim 1, wherein the non-planar dielectric structure includes a first dielectric portion positioned in a plane perpendicular to the substrate and a second dielectric portion positioned in a plane parallel to the substrate.

6. The processor assembly of claim 1, wherein the non-planar dielectric structure includes a corrugated structure having a first plurality of dielectric layer portions positioned in a first plane parallel to the substrate and joined at each side by respective second and third pluralities of dielectric layer portions positioned in a second plane perpendicular to the substrate.

7. The processor assembly of claim 1, wherein the first capacitor terminal is electrically coupled to a first voltage terminal in the memory circuit, and the second terminal in the capacitor is electrically coupled to a second voltage terminal in the memory circuit.

8. The processor assembly of claim 1, further comprising a protective cap layer over the integrated circuit, the memory circuit, and the capacitor, wherein the protective cap layer has a uniform thickness in a region covering the integrated circuit, the memory circuit, and the capacitor.

9. The processor assembly of claim 1, wherein the capacitor substantially covers an area of the interposer that is not covered by the integrated circuit and by the memory circuit.

10. The processor assembly of claim 1, wherein the capacitor mitigates a resonance of the processor assembly in the range of approximately 30-200 MHz.

11. A system, comprising:
    a printed circuit board;
    a processor assembly including:
       an interposer disposed on a substrate;
       an integrated circuit directly disposed on the interposer;
       a memory circuit directly disposed on the interposer and coupled to the integrated circuit; and
       a capacitor at least partially embedded in the interposer, the capacitor including:
          at least a first non-planar conductor structure and a second non-planar conductor structure separated by a non-planar dielectric structure;
          a first capacitor terminal electrically coupling the first non-planar conductor structure to a first voltage terminal in the integrated circuit;
          a second capacitor terminal electrically coupling the second non-planar conductor structure to a second voltage terminal in the integrated circuit; and
          an oxide layer electrically isolating the capacitor from the interposer; and
    a power converter disposed on the printed circuit board, the power converter including:
       a first power converter terminal electrically connected to the first capacitor terminal via a first power supply line in the printed circuit board; and
       a second power converter terminal electrically connected to the second capacitor terminal via a second power supply line in the printed circuit board.

12. The processor assembly of claim 11, wherein the first voltage terminal in the integrated circuit is coupled to a drain voltage in a complementary metal-oxide-semiconductor circuit of the integrated circuit.

13. The processor assembly of claim 11, wherein the second voltage terminal in the integrated circuit is coupled to a source voltage in a complementary metal-oxide-semiconductor of the integrated circuit.

14. The processor assembly of claim 11, wherein the first capacitor terminal and the second capacitor terminal extend to a same height over the substrate as the integrated circuit and the memory circuit.

15. The processor assembly of claim 11, wherein the non-planar dielectric structure includes a first dielectric portion positioned in a plane perpendicular to the substrate and a second dielectric portion positioned in a plane parallel to the substrate.

16. The processor assembly of claim 11, wherein the non-planar dielectric structure includes a corrugated structure having a first plurality of dielectric layer portions positioned in a first plane parallel to the substrate and joined at each side by respective second and third pluralities of dielectric layer portions positioned in a second plane perpendicular to the substrate.

17. The processor assembly of claim 11, wherein the first capacitor terminal is electrically coupled to a first voltage terminal in the memory circuit, and the second terminal in the capacitor is electrically coupled to a second voltage terminal in the memory circuit.

18. The processor assembly of claim 11, further comprising a protective cap layer over the integrated circuit, the memory circuit, and the capacitor, wherein the protective cap layer has a uniform thickness in a region covering the integrated circuit, the memory circuit, and the capacitor.

19. The processor assembly of claim 11, wherein the capacitor substantially covers an area of the interposer that is not covered by the integrated circuit and by the memory circuit.

20. The processor assembly of claim 11, wherein the capacitor mitigates a resonance of the processor assembly in the range of approximately 30-200 MHz.

* * * * *